United States Patent
Starikov et al.

(10) Patent No.: US 7,006,208 B2
(45) Date of Patent: Feb. 28, 2006

(54) DEFECT COMPENSATION OF LITHOGRAPHY ON NON-PLANAR SURFACE

(75) Inventors: Alexander Starikov, Palo Alto, CA (US); Theodore Doros, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 146 days.

(21) Appl. No.: 10/338,790

(22) Filed: Jan. 7, 2003

(65) Prior Publication Data

US 2004/0130689 A1    Jul. 8, 2004

(51) Int. Cl.
*G01J 1/00*    (2006.01)
(52) U.S. Cl. .................... 356/123; 356/138; 356/237.1
(58) Field of Classification Search ................ 356/123, 356/138, 237.1
See application file for complete search history.

(56) References Cited

U.S. PATENT DOCUMENTS 6,330,052 B1 * 12/2001 Yonekawa et al. ............ 355/53
2002/0044269 A1 * 4/2002 Yonekawa et al. ............ 355/53

* cited by examiner

*Primary Examiner*—Gregory J. Toatley, Jr.
*Assistant Examiner*—Roy M. Punnoose
(74) *Attorney, Agent, or Firm*—Schwabe, Williamson & Wyatt, P.C.

(57) ABSTRACT

In an embodiment in accordance with the present invention, methods for dynamic detection and correction of focus and tilt variations that occur during a specific product layer exposure is by focus and tilt pre-compensation during wafer exposure. The method provides two spaced apart paths that provide both defocus and tilt measurements. A reference plane is defined by using three reference areas or fields. The data is fitted, using least squares or max/min error, to a "plane", that is, to straight equidistant lines, the deviation from "plane" is computed as error from a set of straight equidistant lines. Lateral displacements of each band into focus error is converted using the formula: $\Delta Z = \Delta X * \theta$.

9 Claims, 3 Drawing Sheets

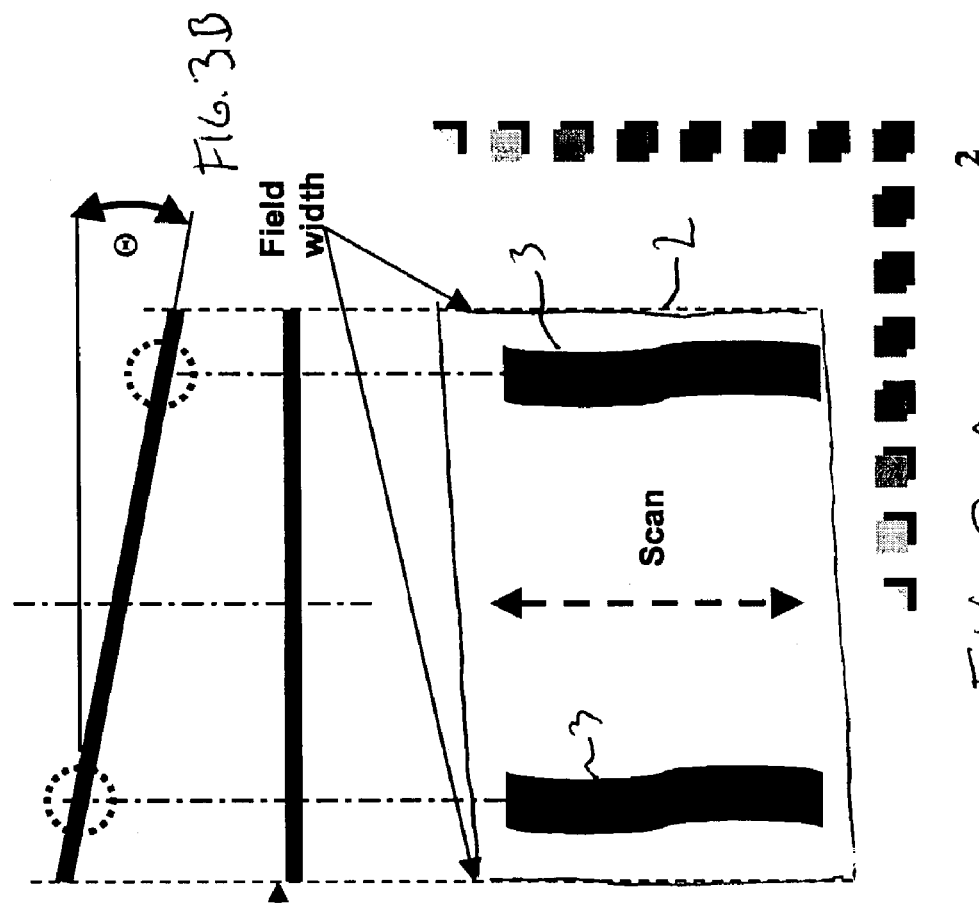
FIG. 3B
FIG. 3A
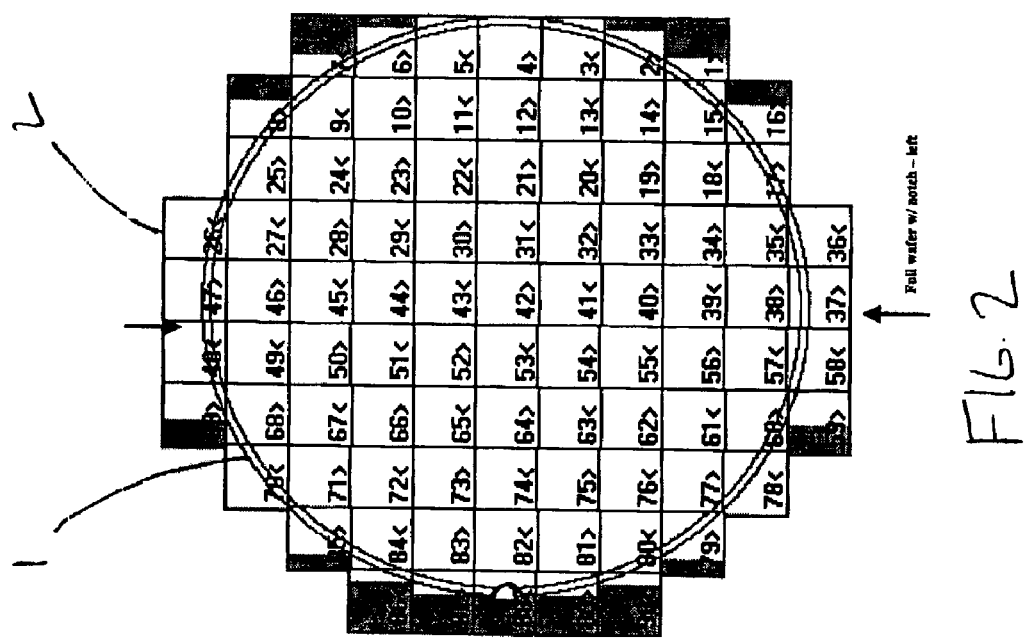
FIG. 2

| Shot number in product file | Shot X; mm | Shot/slot Y; mm (notch down; wafer center is 0;0); | Slot ΔZ; μm | Slot θ; ppm |
|---|---|---|---|---|
| 60 | 80.32 | -60.0 | 0.002 | -0.2 |
| 60 | 80.32 | -60.5 | 0.002 | -0.2 |
| 60 | 80.32 | -61.0 | 0.003 | -0.1 |
| 60 | 80.32 | -61.5 | 0.004 | -0.0 |
| 60 | 80.32 | ... | ... | ... |

FIG. 4

| Shot number in product file | Shot X; mm | Shot/slot Y; (notch down); mm | Slot ΔZ; μm | Slot θ; ppm |
|---|---|---|---|---|
| 60 | 80.32 | -60.0 | -0.002 | 0.2 |
| 60 | 80.32 | -60.5 | -0.002 | 0.2 |
| 60 | 80.32 | -61.0 | -0.003 | 0.1 |
| 60 | 80.32 | -61.5 | -0.004 | 0.0 |
| 60 | 80.32 | ... | ... | ... |
|  |  |  |  |  |

FIG. 5

DEFECT COMPENSATION OF LITHOGRAPHY ON NON-PLANAR SURFACE

FIELD OF THE INVENTION

The present invention relates to optical lithography, and more particularly, to error compensation methods for the step and scan lithography process and system for ultra-high resolution microelectronic device production.

BACKGROUND OF INVENTION

An integrated circuit (IC) is an interconnected network of microcircuits which form discrete IC devices. A microelectronic die comprises a die substrate upon which microcircuits are formed. The die substrates are diced from semiconductor material, examples of which include, among others, wafers of silicon (Si), gallium arsenide (GaAs), Indium Phosphate (InP) and their derivations. Various techniques are used, such as layering, doping, masking, and etching, to build thousands and even millions of microscopic IC devices in the form of transistors, resistors, and others on the wafer. The IC devices are interconnected within individual dice to define a specific electronic circuit that performs a specific function, such as the function of a microprocessor or a computer memory.

Optical micro-lithography is a process used to produce ultra-high resolution features on the wafer. In one aspect of the process, radiation in the deep ultraviolet (DUV) wavelengths produced by a laser and imaged though optics and slit reticles provides the illumination source that projects through the openings of a lithographic mask upon the surface of the wafer. The micro-lithography systems must overcome a multitude of challenges to produce an illumination that is suitable for resolving 150 nm features and below.

One type of optical micro-lithographic system is known as step and scan (S&S). The basic subsystems of the S&S system comprises a laser subsystem to provide the radiation, beam focusing and scanning subsystem that shapes and guides the radiation, and the wafer subsystem in which the wafer is processed.

The challenges of providing error-free illumination can be addressed at the subsystem level. The laser must provide radiation at a predefined wavelength and uniformity of power. Illumination errors develop if the wavelength and/or power were to drift from nominal.

The beam focusing and scanning subsystem must carry, process and steer the radiation to illuminate predetermined areas of the wafer. This subsystem comprises lenses, filters, mirrors, and positioning mechanisms. Errors occur at the lenses due to issues of alignment, astigmatism, as well as compaction and absorption which can vary over time. Filters have similar error potential as the lenses. The mirrors have issues related to alignment and flatness.

The wafer subsystem must be able to carry and support the wafer during scanning (the wafer stage) as well as provide the final component of illumination control (the reticle stage). At the wafer stage, errors are introduced due to wafer handling, including issues related to the wafer chuck flatness, alignment, conveyance, positioning, and control systems. The positioning mechanisms have issues related to mechanical devices, such as alignment, wear, inertia, and vibration. The control systems must provide suitable algorithms for numerical control of the positioning actuators, with feedback control for dynamic correction. At the reticle stage, the illumination is shaped by passing the radiation through an illumination slit to illuminate the desired scan field. Errors related to reticle issues include accuracy of manufacture, alignment, and wear.

Step and scan refers to the process in which the wafer is illuminated. The reticle comprises a rectangular slit that projects a rectangular exposure onto the wafer surface. The rectangular exposure is scanned across the surface of the wafer in multiple, predefined fields. The scanned field is also a rectangular. Issues related to the quality of the illumination at the surface of the wafer are compounded by all the potential error issues of the individual subsystems, which can produce a scanned field that has issues of static and dynamic distortion, image plane deviations, and overlay.

Another important factor related to potential errors in the S&S system include wafer quality. At the resolutions of interest, wafer planarity is a crucial factor in illumination focus. Control for real-time focusing is required to follow the terrain of the wafer. The focus is controlled by sampling a finite number of areas as the wafer is scanned. Servo controlled wafer stages adjust the position of the wafer to keep the wafer's surface at the optimum lithographic focal point. A compromise has to be made as only a finite number of samples are made which must be averaged over the scanned field.

Additional sources of focus error as a result of wafer quality include: vendor-specific wafer bevel and systematic non-parallelism; layer- and process-specific wafer thickness variation, such as interlayer dielectric (ILD) deposition and chemical and mechanical planarization (CMP) variations;.

Focus error can also be caused by focus sensors and focus software interacting with machine variables. Focus error can also be caused by the errors of conventional metrologies and monitors of focus and tilt, and in particular, where these errors are not the same during test and during production exposure.

These errors issues accumulate at the exposure location, and therefore the errors must be tightly budgeted. In order to minimize errors characteristic in S&S systems, the subsystems are held to the tightest of tolerance achievable, which dramatically increases the cost of the system. In-line defect monitoring is used but is limited by sampling rate and damage assessment/mitigation.

Methods are needed to control and adjust for the characteristic error issues inherent in the S&S system. As IC device resolution is made even smaller, negating these error issues become critical.

BRIEF DESCRIPTION OF DRAWINGS

FIG. 2 is a top view of a wafer mapped into fields in accordance with an embodiment of a method of the present invention;

FIG. 3A represents a scan comprising two data collection paths across a field, in accordance with an embodiment of a method of the present invention;

FIG. 3B represents the error as a deviation from the defect free condition, represented by a horizontal line, in accordance with an embodiment of a method of the present invention;

FIG. 4 is an example of the data found in the product file for a particular layer, in accordance with an embodiment of a method of the present invention; and FIG. 5 is a compensation file for the same field using methods in accordance with the present invention.

DESCRIPTION

Figure 1:
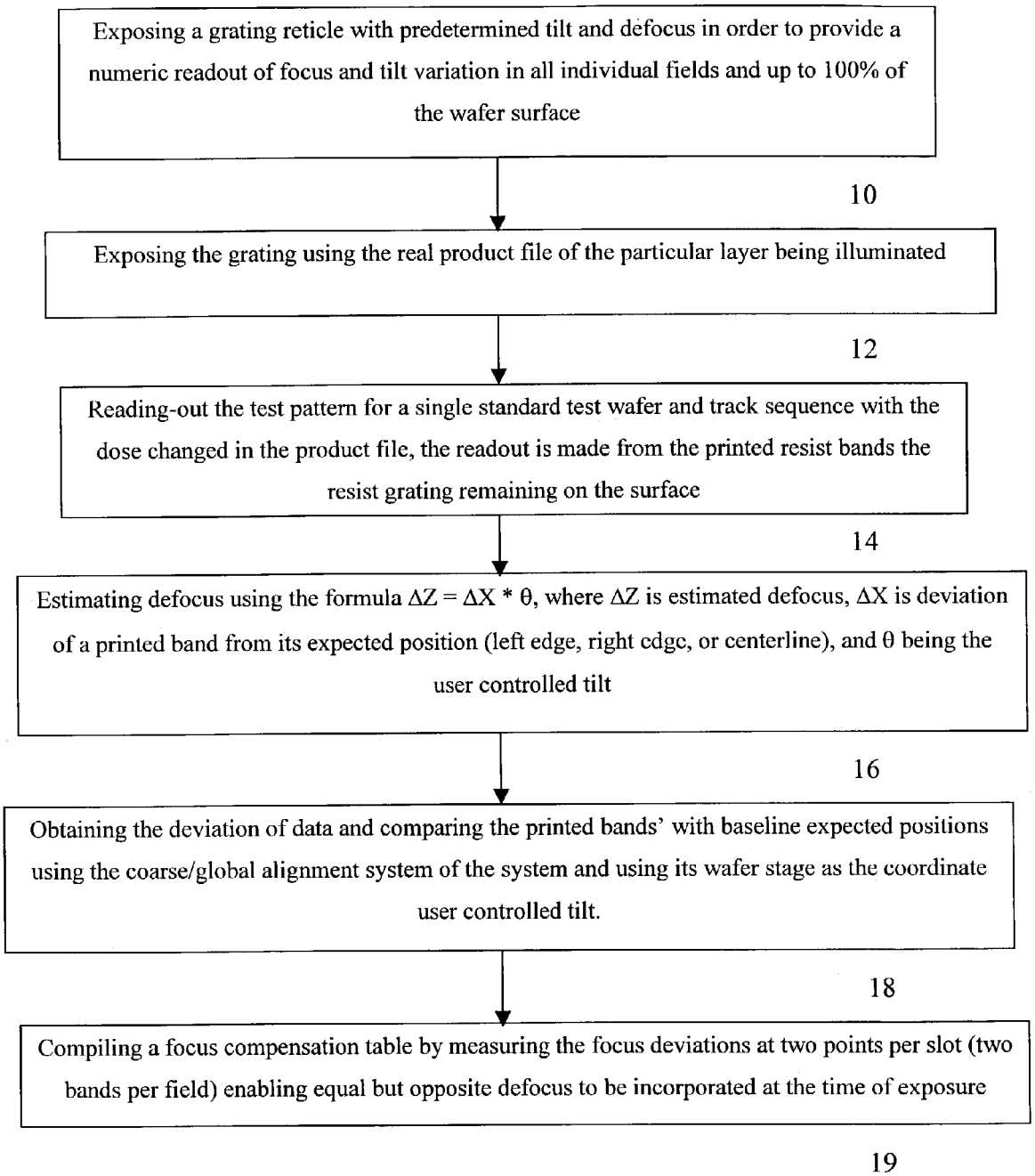
FIG. 1 is a flow diagram of a method, in accordance with an embodiment of the present invention, for dynamic pre-compensation of focus and tilt.

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

In an embodiment in accordance with the present invention, methods for dynamic detection and correction of focus and tilt variations that occur during a specific product layer exposure is by focus and tilt pre-compensation during wafer exposure. The method provides for correction over the entire exposed wafer surface. The methods do not depend on the correction of error issues at each component of the system or wafer, but by accounting and accommodating for the total accrued error at the point of use correction at the point of illumination.

FIG. 1 is a flow diagram of a method, in accordance with an embodiment of the present invention, for dynamic pre-compensation of focus and tilt, comprising: exposing a grating reticle with predetermined tilt and defocus in order to provide a numeric readout of focus and tilt variation in all individual fields and up to 100% of the wafer surface 10; exposing the grating using the real product file of the particular layer being illuminated 12; reading-out the test pattern for a single standard test wafer and track sequence with the dose changed in the product file the readout made from the printed resist bands the resist grating remaining on the surface 14; estimating defocus using the formula $\Delta Z=\Delta X*\theta$, where $\Delta Z$ is estimated defocus, $\Delta X$ is deviation of a printed band from its expected position (left edge, right edge, or centerline), and $\theta$ being the user defined tilt 16; obtaining the deviation of data and compare the printed bands' with baseline expected positions using the coarse/global alignment system of the system and using its wafer stage as the coordinate system 18; and compiling a focus compensation table by measuring the focus deviations at two points per slot (two bands per field) enabling equal but opposite defocus to be incorporated at the time of exposure.

In another embodiment of the method for dynamic pre-compensation of focus and tilt, in accordance with the present invention comprising: estimating the correction over a full wafer surface (all scan fields) and applying the correction over the same wafer surfaces; and obtaining the read-out of the focus error and its compensation made on the congruent domains, that is, the same number of degrees of freedom compensating for all error issues in the system.

The remaining set up of the focus and tilt (to account for field/slot curvature, aberrations, dose and partial coherence) is limited to mean focus and mean tilt.

The existing AXXIOM alignment system and wafer stage of the Micrascan system (Wilton, Conn.) can be utilized to automate metrology of the titled grating test wafer. This provides a 2 mm sampling in the scan direction, left and right in slot; a complete measurement of defocus on a wafer exposed by a step-and-scan system is good to 1 nm.

FIG. 2 is a top view of a wafer 1 mapped into 90 fields 2; the fields 2 being referenced above, in accordance with an embodiment of a method of the present invention. FIG. 3A represents a scan comprising two data collection paths 3 across a field 2, in accordance with an embodiment of a method of the present invention. FIG. 3B represents the error as a deviation from the defect free condition, represented by a horizontal line, in accordance with an embodiment of a method of the present invention;

Two spaced apart paths 3 provide both defocus and tilt measurements. A reference plane is defined by using three reference areas or fields 2. The data is fitted, using least squares or MAX/MIN error, to a "plane", that is, to straight equidistant lines, the deviation from "plane" is computed as error from a set of straight equidistant lines. Lateral displacements of each band into focus error is converted using the formula.

$$\Delta Z=\Delta X*\theta$$

An example calculation for a typical test wafer would look like:

$$\theta=400 \text{ ppm}=400*10^{-6}; \Delta X=1.5 \text{ mm}; \Delta Z=0.6 \mu m$$

FIG. 4 is an example of the data found in the product file for a particular layer. FIG. 5 is a compensation file for the same field using methods in accordance with the present invention. These data are used for full wafer dynamic pre-compensation of focus and tilt on each field.

The input data file of FIG. 5 results in error correction superior over the currently used average field and +/− error calibration tables. Such calibration tables are typically limited to less than 50 variables, with these variables being system variables, providing an incomplete solution for error compensation. The methods in accordance with embodiments of the present invention, have inherently much higher number of degrees of freedom, essentially matching the number of degrees of freedom in the entire system and enabling a near-perfect compensation of systematic focus errors, as refined as for each specific product and each specific layer of the product, as required.

The error correction is estimated over a full (all field on a wafer) time sequence, defined as data gathered over all the fields, and the error correction is also applied over a full time sequence, limited only by the bandwidths of focus sensor, servo, and stage actuators. The read-out of the focus error and its compensation are made on the congruent domains, the same number of degrees of freedom, so that the compensation corrects for the all errors in the system. This contrasts with the current practice of using field focus compensation in which the average focus/tilt and servo error in +/− scan are used in the form of average field and average +/− difference.

The embodiments of the methods in accordance with the present invention provide a densely sampled through scan focus and tilt errors at each exposed field, and a dense through scan dynamic correction for focus and tilt on each field. The printing of a tilted and defocused grating for two points in the field yields a complete description of image focus through scan, an estimate of defocus/variation derived from the lateral displacement of printed image; and accounts for all sources of focus error in image of all exposed fields.

The embodiments of the methods in accordance with the present invention provide error control and correction on each wafer during the production, not just on test or diagnostic wafers, in contrast with conventional methods. Conventional methods of focus issues require labor intensive and expensive adjustments in tools and materials. The methods of the present invention provide for compensation of all focus imperfection by way of metrology and control loop at the point of exposure.

The embodiments of the methods in accordance with the present invention are not limited to single stage systems, but can be utilized on twin-stage system and on top throughput systems.

The embodiments of the methods in accordance with the present invention provide focus diagnostic, metrology of defocus, including dose, vibration, and track process errors, product- and layer-specific errors, as well as tool hardware- and software-specific focus errors. The focus errors are correlated into a system variable database to correct for the focus errors.

The embodiments of the methods in accordance with the present invention can be extended beyond focus control, a can be utilized for, but not limited to, control of dose (effective exposure dose, a factor of the performance of the lithography tool and of the track/process; lithography tool in-plane stage vibration; astigmatic patterning effects; generic test of adhesion failure; generic link qualification for patterning and process defects; reticle/array centration with respect to the wafer edges; blade centration with respect to the pattern on reticle; EBR centration with respect to the wafer edges; claw centration with respect to the wafer edges; among others.

The embodiments of the methods in accordance with the present invention allow for: the relaxation of tolerance specifications; maintaining relaxed shape/focus-related control at all steps of the process up to the "point of use"; the closing of the focus control loop at the point of use as required for actual need on each product; superior focus control by a method that is forgiving of accrued focus errors, The embodiments of the methods in accordance with the present invention account for focus errors due to reticle and wafer stage platens, wafer chuck non-flatness/wear and systematic chucking errors, wafer non-parallelism and wafer processing, including CMP, SOG and sputtering.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method for dynamic pre-compensation of focus and tilt, comprising:
   estimating the error correction over a full wafer surface, including all scan fields, the estimating including
      exposing a grating reticle with predetermined tilt and defocus in order to provide a numeric readout of focus and tilt variation in all individual fields,
      exposing the grating using the real product file of the particular layer being illuminated,
      reading-out the test pattern for a single standard test wafer and track sequence with the dose changed in the product file,
      estimating defocus using the formula $\Delta Z = \Delta X * \theta$, where $\Delta Z$ is estimated defocus, $\Delta X$ is deviation of a printed band from its expected position (left edge, right edge, or centerline), and $\theta$ being the user-controlled tilt,
      obtaining the deviation of data and comparing the printed bands' with baseline expected positions, and
      compiling a focus compensation table by measuring the focus deviations at two bands per field, enabling equal but opposite defocus to be incorporated at the time of exposure;
   applying the correction over the same wafer surfaces; and
   obtaining the read-out of the focus error and its compensation made on the congruent domains.

2. A method for dynamic pre-compensation of focus and tilt, comprising:
   exposing a grating reticle with predetermined tilt and defocus in order to provide a numeric readout of focus and tilt variation in all individual fields;
   exposing the grating using the real product file of the particular layer being illuminated;
   reading-out the test pattern for a single standard test wafer and track sequence with the dose changed in the product file;
   estimating defocus using the formula $\Delta Z = \Delta X * \theta$, where $\Delta Z$ is estimated defocus, $\Delta X$ is deviation of a printed band from its expected position (left edge, right edge, or centerline), and $\theta$ being the user-controlled tilt;
   obtaining the deviation of data and comparing the printed bands with baseline expected positions; and
   compiling a focus compensation table by measuring the focus deviations at two points per slot (two bands per field) enabling equal but opposite defocus to be incorporated at the time of exposure.

3. The method of claim 2, wherein exposing a grating reticle with predetermined tilt and defocus in order to provide a numeric readout of focus and tilt variation in all individual fields comprises:
   exposing a grating reticle with predetermined tilt and defocus in order to provide a numeric readout of focus and tilt variation in all individual fields and up to 100% of the wafer exposure.

4. The method of claim 2, wherein reading-out the test pattern for a single standard test wafer and track sequence with the dose changed in the product file, comprises:
   reading-out the test pattern for a single standard test wafer and track sequence with the dose changed in the product file, the readout made from the printed resist bands the resist grating remaining on the surface.

5. The method of claim 2, wherein obtaining the deviation of data and comparing the printed bands with baseline expected positions comprises:
   obtaining the deviation of data and comparing the printed bands with baseline expected positions using the coarse/global alignment system of the system and using its wafer stage as the coordinate user controlled tilt.

6. The method of claim 2, wherein obtaining the deviation of data and comparing the printed bands' with baseline expected positions comprises:
   obtaining the deviation of data and comparing the printed bands with baseline expected positions using a stand alone macro inspection system.

7. The method of claim 2, wherein obtaining the deviation of data and comparing the printed bands' with baseline expected positions comprises:
   obtaining the deviation of data and comparing the printed bands with baseline expected positions using and integral macro inspection system.

8. A method for dynamic pre-compensation of focus and tilt, comprising:
- measuring defocus and tilt at two spaced apart paths within a field;
- defining a reference plane using three reference areas or fields;
- fitting the data using least squares or max/min error to a plane defined by two straight equidistant lines;
- computing the deviation from "plane" as error from a set of straight equidistant lines; and
- converting the lateral displacements of each band into focus error using the formula $\Delta Z = \Delta X * \theta$, where $\Delta Z$ is estimated defocus, $\Delta X$ is deviation of a printed band from its expected position (left edge, right edge, or centerline), and $\theta$ being the user-controlled tilt.

9. The method of claim 8, further comprising:
- estimating the error correction over a full wafer surface, including all scan fields, and applying the correction over the same wafer surfaces; and
- obtaining the read-out of the focus error and its compensation made on the congruent domains.

* * * * *

UNITED STATES PATENT AND TRADEMARK OFFICE
CERTIFICATE OF CORRECTION

PATENT NO. : 7,006,208 B2 Page 1 of 1
APPLICATION NO. : 10/338790
DATED : February 28, 2006
INVENTOR(S) : Starikov et al.

It is certified that error appears in the above-identified patent and that said Letters Patent is hereby corrected as shown below:

Column 6 Claim 7
Lines 66-67, "...using and integral macro..." should read --...using an integral macro...--.

Signed and Sealed this

Thirty-first Day of March, 2009

JOHN DOLL
*Acting Director of the United States Patent and Trademark Office*